United States Patent [19]

Dentai et al.

[11] 3,718,601

[45] Feb. 27, 1973

[54] FLUORESCENT HIGH ALUMINA SUBSTRATES

[75] Inventors: Andrew Gomperz Dentai, Plainfield; Le Grand Gerard Van Uitert, Morris Township, Morris County; John Charles Williams, Whippany, all of N.J.

[73] Assignee: Bell Telephone Laboratories, Incorporated, Murray Hill, N.J.

[22] Filed: Jan. 4, 1971

[21] Appl. No.: 103,418

[52] U.S. Cl. ..........252/301.4 R

[51] Int. Cl. ..........C09k 1/10

[58] Field of Search ..........252/301.4 R, 301.4 F; 250/71 T

[56] References Cited

UNITED STATES PATENTS

| | | | |
|---|---|---|---|
| 3,282,856 | 11/1966 | Borchardt | 252/301.4 R |
| 3,359,211 | 12/1967 | Jaffe | 252/301.4 F |
| 3,503,894 | 3/1970 | Wachtel | 252/301.4 F |

*Primary Examiner*—Robert D. Edmonds
*Attorney*—R. J. Guenther and Edwin B. Cave

[57] ABSTRACT

Substrate-supported circuitry is manufactured by forming circuitry on a high alumina dielectric substrate having a fluorescent character arising from the incorporation of both europium oxide plus yttrium (and/or lanthanum and/or gadolinium) oxide, with the latter oxide (s) acting as a dispersing agent. Testing the integrity of the circuitry is accomplished by irradiating the substrate with ultraviolet light and sensing the passage of any visible light through the circuitry that may occur in the presence of defects.

9 Claims, 2 Drawing Figures

INVENTORS A. G. DENTAI
L. G. VAN UITERT
J. C. WILLIAMS

BY George S. Indig
ATTORNEY

FLUORESCENT HIGH ALUMINA SUBSTRATES

BACKGROUND OF THE INVENTION

1. Field of the Invention

This invention relates to the manufacture of circuit modules, such as printed circuit boards or thin-film circuit plates, wherein a dielectric ceramic substrate supports circuitry and, particularly, to the testing of the circuitry in such modules for dimensional accuracy, short circuits, open circuits, and the like.

2. Description of the Prior Art

Miniaturization of electronic circuitry is becoming more important as technology advances and as voltage requirements decrease. Typically, circuits consisting of capacitors, resistors, leads, and the like, are produced by some sort of prior art, such as metallization, on the surface of dielectric substrates. For reasons relating to electrical, mechanical, and thermal properties, high alumina compositions are finding increasing favor in these applications.

The problems encountered in producing miniaturized circuits involve the need to maintain close control of the patterns produced, as well as the need to detect such defects as short circuits, open circuits, and the like. The testing of the circuit module is commonly done either by electrical methods or by visual inspection, both of which, under the present conditions of production, are cumbersome and time-consuming. The use of an electronic sensing device that can detect such defects previously mentioned by scanning a fluorescent dielectric substrate exposed to ultraviolet radiation has been proposed in a patent application by C. D. Irish, Ser. No. 838,259, filed on July 1, 1969, now U.S. Pat. No. 3,617,744.

The preparation of a fluorescent dielectric substrate of a high alumina composition for such a use had not been accomplished prior to the present invention, primarily due to the known problems of producing fluorescence of sufficient intensities in these high alumina compositions. It has been observed that fluorescent species known to exhibit generally excellent fluorescing properties, for example, $Tb^{3+}$, lose those properties to a large extent when incorporated in alpha-aluminum oxide. This problem has been discussed for example, by S. Geschwind and J. P. Remeika, Vol. 122, No. 3, *Physical Review*, 1961, pp. 757–761 and by I. Adams and J. W. Mellichamp, Vol. 36, No. 9, *Journal of Chemical Physics*, 1962, pp. 2456–2459.

SUMMARY OF THE INVENTION

In accordance with the invention, the problems of preparing fluorescent alumina substrates having the desired intensities are overcome by mixing europium, present as the oxide or its equivalent nitrate, sulfate, etc., with yttrium, lanthanum, or gadolinium oxide or its equivalent to obtain, when in combination with alumina, a fluorescent material.

The color of the fluorescence is controllable by means of selecting either an oxidizing or a reducing atmosphere in the final firing of the europium containing substrate the former atmosphere yielding a reddish-orange color and the latter atmosphere yielding a color ranging from white to blue, depending on the severity of the reducing conditions.

Finally, a preferred aspect of the invention is directed to the use of such fluorescent alumina substrates as an aid in the production of thin film circuits. This is accomplished by exposing the substrate to ultraviolet radiation and viewing the flaws and defects in the circuitry by some means, such as visual or electronic.

DETAILED DESCRIPTION OF THE INVENTION

1. The Drawing

Figure 1:
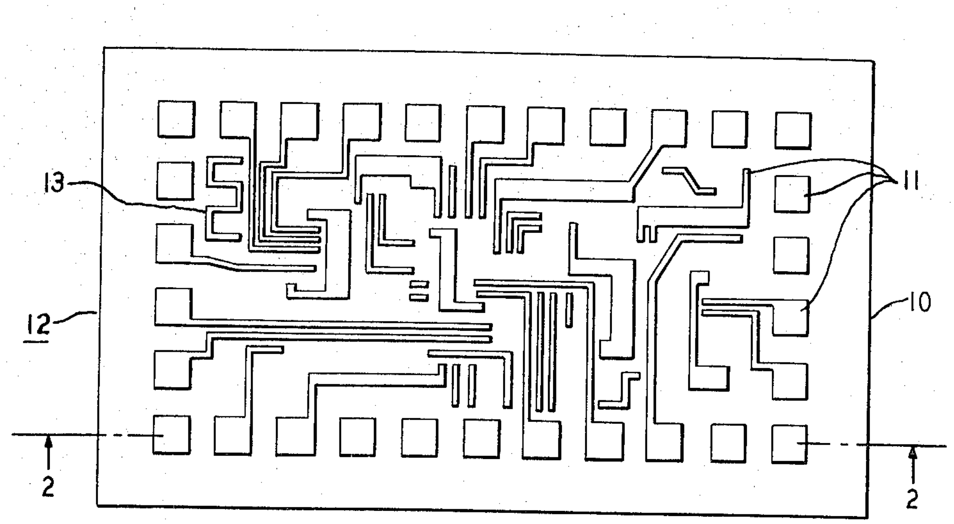
FIG. 1 is a plan view of a thin-film circuit module manufactured and tested in accordance with the invention, and utilizing a substrate of the invention; and, FIG. 2 is a cross section along direction 2—2 of FIG. 1.
Figure 2:
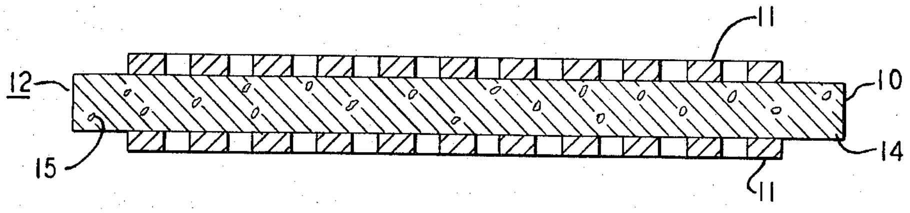

In FIGS. 1 and 2, dielectric ceramic substrates 10 support metallic circuitry 11 on their upper faces and, possibly, undersides to form electrical modules 12 that can be connected with other modules or other electrical network. In FIGS. 1 and 2, the circuitry 11 is composed of variously shaped metal elements 13 that include circuit components such as thin-film resistors, capacitors, and leads.

In FIGS. 1 and 2, the substrate 10 is composed of an alumina ceramic wafer 14 including a dispersed second phase 15 consisting of a material containing europium, which has been processed and added to the ceramic in accordance with the invention.

The thicknesses of the substrate, substrate portions, and circuitry have been exaggerated in FIG. 2 for clarity. The actual thicknesses conform to that normal in the practice of the art.

2. Processing Conditions

The fluorescent substrate of the invention is a polycrystalline ceramic which substantially lacks any glassy phase (less than 4 percent by volume). It may be obtained from compositions of starting materials within the range expressed by the ratio (parts by weight) of 96 to 100 of aluminum oxide, and from 0 to 4 total of magnesium oxide, silicon dioxide, and calcium oxide, to which is added from 0.1 to 2 parts (per 100 parts by weight of the foregoing composition) of a presintered "rare earth mixture" of the oxides of europium plus yttrium and/or lanthanum, and/or gadolinium. With the exception of terbium, none of the other rare earth elements are suitable for the invention, either because their presence reduces the fluorescent intensity of europium or they are too expensive to be used in commercial production. On the other hand, while yttrium, lanthanum, and gadolinium, as well as limited amounts of terbium (up to 50 weight percent of the total rare earth mixture), enhance the fluorescent intensity of europium in alumina, yttrium is normally preferred over lanthanum, gadolinium, and terbium for reasons of economy and fluorescent efficiency.

The fluorescent substrate of the invention may be produced by methods well known in the art, with the added condition that the observed color of the fluorescence depends on the atmosphere to which the ceramic is exposed during final firing. Thus, oxidizing atmospheres, such as air, tend to produce a substrate that, upon exposure to ultraviolet radiation, appears reddish-orange, while mildly reducing atmospheres, such as 95 parts nitrogen plus 5 parts hydrogen, tend to produce a substrate that appears white, and highly reducing atmospheres, such as dry hydrogen, tend to produce a substrate that appears blue. An exemplary procedure will be briefly described to aid the practitioner, although other techniques may be formed which will also result in a satisfactorily fired body.

Precautions taken by those skilled in the art concerning the presence of impurities or modifying ingredients in starting materials is sufficient for the practice of the invention. However, in addition to the additives described above, impurities present should ordinarily be kept below about 1.0 percent by weight total, including no more than 0.2 percent by weight total of Group VIII elements of the Periodic Table (iron, cobalt, nickel, ruthenium, rhodium, palladium, osmium, iridium and platinum), to avoid reduction of the intensity of the fluorescence.

The starting materials of the rare earth mixture as the oxides or other compounds which, upon firing, will yield the oxides, such as carbonates, are thoroughly mixed to ensure that subsequent reactions take place completely and uniformly. This mixing is usually carried out by forming an aqueous or organic slurry in a ball mill. The material is then dried, granulated, and prereacted by calcining generally at a temperature of from 500° C. to 800° C. for from ½ hour to 4 hours.

Other examples of methods of preparing the rare earth mixture are also known in the art. One method includes coprecipitation of the appropriate oxides or compounds which will yield the oxides, such as carbonates, prior to the calcining step. Alternatively, freeze-drying of the appropriate oxides, halides, carbonates, sulfates, etc. according to procedures known in the art may also be done prior to the calcining step. Finally, $Eu^{3+}$can be replaced by $Eu^{2+}$in any of the above methods.

After calcining, the material is then pulverized to break up the agglomerations formed during calcining. While not necessary, the resulting powder is then preferably fired (sintered) in a highly reducing atmosphere, such as dry hydrogen, at a temperature of from 1200°C to 1500°C for from ½ hour to 6 hours in order to ensure intimate mixing of the oxides. When all other further processing conditions are held equal, sintering in hydrogen leads to a final product having the greatest fluorescent intensity observed, while sintering in a mixture of nitrogen-hydrogen (92 to 98 parts by weight nitrogen, and the balance hydrogen) gives a final product having a lesser fluorescent intensity. Sintering in air gives a final product that has a still lower fluorescent intensity; however, even this product is superior to that formed by adding $Eu_2O_3$ alone to the alumina substrate.

The rare earth mixture is then added to the desired ratio of initial ingredients, consisting of aluminum oxide, together with any magnesium oxide, silicon dioxide, and calcium oxide, the entirety being placed in a ball mill together with one or more forming aids such as binders, lubricants, and plasticizers and an aqueous or organic carrier to form a slurry. The particular forming aid selected and the proportion in which they are added depends upon the method chosen for forming the material into bodies having green strength. Dry pressing or doctor-blading may be preferred where a flat surface having a mechanically detectable smooth surface profile is desired. In dry pressing, the slurry is deaired, dried and powdered, to pass, for example, a 200-mesh screen. It is then poured into dies and pressed at from 3,000 psi to 60,000 psi.

In doctor-blading, or sheet casting, the slurry, following deairing, is generally formed into a thin sheet of wet ceramic by feeding it onto a carrier which is moving at a constant speed just under a knife blade whose edge is parallel to the surface of the carrier. After air drying, the green sheet is ready for firing.

Once formed into a body having green strength, the material is heat-treated in air (500°C to 800°C) for a period of time (½ hour to 2 hours) to remove the forming aid. Subsequently, the body is fired at a temperature of from 1500°C to 1650°C for from 2 to 8 hours. The atmosphere here may be selected to give the desired fluorescent color upon exposure to ultraviolet radiation. The fluorescent color observed upon exposure of the final product to ultraviolet radiation depends on the oxidation state of europium. $Eu^{3+}$appears red in ultraviolet radiation, while $Eu^{2+}$appears blue. Combinations of various proportions $Eu^{2+}$and $Eu^{3+}$lead to various shades of from bluish-white to a reddish-orange. $Eu^{3+}$is obtained by firing the final product (which is the admixture of the rare earth mixture produced in accordance with the invention and the initial ingredients) in an oxidizing atmosphere, such as air or oxygen. $Eu^{2+}$, obtained by sintering the rare earth mixture in hydrogen, is retained by firing the final product in a reducing atmosphere, such as dry hydrogen. A bluish-white color, indicative of the presence of both $Eu^{2+}$and $Eu^{3+}$, is obtained by firing the final product in a mildly reducing atmosphere such as composed of from 92 to 98 parts by weight of nitrogen and the balance hydrogen (this mixture is also known as forming gas).

Under all three atmospheric conditions of processing of the final product, the ratio of Eu:Y and/or La and/or Gd for optimum results has been found to range from 1:3 to 1:25 parts by weight. However, the maximum intensity of fluorescence is obtained when that ratio is near 1:4 for Eu:Y and Eu:Gd, and near 1:20 for Eu:La.

A number of experiments have been performed to demonstrate that the process outlined above results in the increase in fluorescent intensity as claimed. For example, varying the atmospheric conditions of the firing of the final product leads to the observation that firing in forming gas gives the strongest intensity of emission, firing in air gives a lesser intensity, and firing in hydrogen gives the least intensity. Processing in any of these conditions, however, again yields a final product having a considerably stronger fluorescent intensity than if $Eu_2O_3$ alone is added to the high alumina composition prior to forming the substrate. This verifies that the key to the invention is the use of yttrium (or lanthanum or gadolinium) as a diluent for europium, which enables the addition of europium to the alumina to produce a more efficiently fluorescing product.

a. Preferred Example of Preparation of The Substrate

Chemically pure starting materials were combined to give a rare earth mixture having the composition in percent by weight of 72.5 $Y_2O_3$ and 27.5 $Eu_2O_3$ and were mixed with cellusolve acetate in a ball mill for 6 hours.

The resultant slurry was filtered, dried, and calcined at 600°C for 2 hours in air. The powder, following grinding, was then fired at 1350°C for 2 hours in dry hydrogen. The powder was then added in the amount of 1 percent by weight to a mixture of 99.5 percent by weight aluminum oxide, and the balance magnesium oxide in a ball mill together with a solvent (composed of trichloroethylene and methyl alcohol), a binder (polyvinyl butyral), and a plasticizer and deflocculant (polyalkaline glycol) for preparation by doctor-blading; the mixture was ball-milled for 6 hours. Following doctor-blading, the green ceramic was pre-sintered at 500°C in air for ½ hour and fired at 1520°C for 2 hours in a mildly reducing atmosphere of 95 parts by weight of nitrogen and the balance hydrogen. The resulting substrate exhibited a bluish-white color of the desired intensity upon exposure to ultraviolet radiation.

3. Use of the Fluorescent Substrate

A preferred aspect of the invention is directed to the use of the fluorescent substrate as an aid in the manufacture of thin film circuits. Following production of a circuit consisting of capacitors, resistors, leads, and the like, by some sort of prior art, such as metallization, defects, such as short circuits, open circuits, dimensional accuracies, and the like, can be checked by comparing a standard pattern with the actual pattern produced. Illumination of the substrate by ultraviolet radiation then exposes such defects.

What is claimed is:

1. A process for preparing fluorescent high alumina substrates, in which substrates are produced by a procedure comprising thoroughly mixing initial ingredients that will yield at least approximately 99.5 percent by weight of aluminum oxide and up to 0.2 percent total by weight of Group VIII elements and firing said initial ingredients, characterized in that said initial ingredients are admixed with from 0.1 to 2 parts (per 100 parts by weight of the said total composition) of an intimate mixture consisting essentially of 1 part of europium, together with from 3 to 25 parts of at least one of the trivalent ions selected from the group consisting of yttrium, lanthanum, and gadolinium.

2. The process of claim 1 in which said initial ingredients include a balance which is substantially at least one of the compounds selected from the group consisting of magnesium oxide, silicon dioxide, and calcium oxide.

3. The process of claim 2 in which said initial ingredients include a balance which is substantially magnesium oxide.

4. The process of claim 1 in which said intimate mixture consists essentially of 1 part europium and 4 parts yttrium in oxidic form.

5. The process of claim 1 in which said intimate mixture is formed by calcining the oxides or compounds that will give the oxides, such as carbonates, at a temperature of from 500°C to 800°C for from ½ hour to 4 hours, followed by sintering at a temperature of from 1200°C to 1500°C for from ½ hour to 6 hours.

6. The process of claim 5 in which said sintering is done in dry hydrogen.

7. The process of claim 1 in which said substrate is fired at a temperature of from 1500°C to 1650°C for from 2 to 8 hours in one of the atmospheres selected from the group consisting of air, oxygen, nitrogen, hydrogen, and nitrogen-hydrogen, following the admixing of said intimate mixture with said initial ingredients.

8. The process of claim 7 in which said nitrogen-hydrogen atmosphere is comprised of from 92 to 98 parts by weight of nitrogen, and the balance hydrogen.

9. The product made by the process of claim 1.

* * * * *